(12) United States Patent
Gandhi et al.

(10) Patent No.: US 10,580,746 B2
(45) Date of Patent: Mar. 3, 2020

(54) BONDING PADS WITH THERMAL PATHWAYS

(71) Applicant: MICRON TECHNOLOGY, INC., Boise, ID (US)

(72) Inventors: Jaspreet S. Gandhi, Boise, ID (US); James M. Derderian, Boise, ID (US); Sameer S. Vadhavkar, Boise, ID (US); Jian Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/102,960

(22) Filed: Aug. 14, 2018

(65) Prior Publication Data

US 2018/0374810 A1    Dec. 27, 2018

Related U.S. Application Data

(60) Division of application No. 15/344,893, filed on Nov. 7, 2016, now Pat. No. 10,163,830, which is a (Continued)

(51) Int. Cl.
    *H01L 23/00*      (2006.01)
    *H01L 23/48*      (2006.01)
    (Continued)

(52) U.S. Cl.
CPC .............. *H01L 24/06* (2013.01); *H01L 21/78* (2013.01); *H01L 23/34* (2013.01); *H01L 23/3677* (2013.01); *H01L 23/481* (2013.01); *H01L 24/03* (2013.01); *H01L 24/05* (2013.01); *H01L 24/14* (2013.01); *H01L 24/17* (2013.01); *H01L 25/0657* (2013.01); *H01L 25/50* (2013.01); *H01L 24/13* (2013.01); *H01L 24/16* (2013.01); *H01L 2224/0362* (2013.01); *H01L 2224/03622* (2013.01); *H01L 2224/05015* (2013.01); *H01L 2224/05025* (2013.01); *H01L 2224/05144* (2013.01); *H01L 2224/05147* (2013.01); *H01L 2224/05155* (2013.01); *H01L 2224/05164* (2013.01); *H01L 2224/06519* (2013.01); *H01L 2224/13025* (2013.01); *H01L 2224/14519* (2013.01); *H01L 2224/16145* (2013.01); *H01L 2224/16146* (2013.01); *H01L 2224/17519* (2013.01); *H01L 2225/06513* (2013.01); *H01L 2225/06541* (2013.01); (Continued)

(58) Field of Classification Search
CPC ............................................ H01L 2224/48247
See application file for complete search history.

(56) References Cited

U.S. PATENT DOCUMENTS 5,291,062 A    3/1994   Higgins, III
5,870,289 A *   2/1999   Tokuda ............... H01L 21/6835
                                                          361/779

(Continued)

*Primary Examiner* — Thao P Le
(74) *Attorney, Agent, or Firm* — Dorsey & Whitney LLP

(57) ABSTRACT

Apparatuses and methods for providing thermal pathways from a substrate to a thermal bonding pad. The thermal pathways may be metal extensions of the thermal bonding pad that are disposed in channels formed in a backside passivation layer underneath the thermal bonding pad, and may be in direct contact with an underlying substrate. The thermal pathways may provide improved thermal dissipation from the substrate.

19 Claims, 5 Drawing Sheets

Related U.S. Application Data continuation of application No. 14/617,375, filed on Feb. 9, 2015, now Pat. No. 9,515,002.

(51) Int. Cl.
*H01L 23/367* (2006.01)
*H01L 23/34* (2006.01)
*H01L 21/78* (2006.01)
*H01L 25/065* (2006.01)
*H01L 25/00* (2006.01)

(52) U.S. Cl.
CPC ........... *H01L 2225/06589* (2013.01); *H01L 2924/00014* (2013.01); *H01L 2924/1304* (2013.01)

(56) References Cited

U.S. PATENT DOCUMENTS

| | | | |
|---|---|---|---|
| 7,015,060 | B1 | 3/2006 | Kubena et al. |
| 9,048,298 | B1 | 6/2015 | Huemoeller et al. |
| 9,515,002 | B2 | 12/2016 | Gandhi |
| 10,163,830 | B2 | 12/2018 | Gandhi et al. |
| 2004/0195669 | A1 | 10/2004 | Wilkins et al. |
| 2009/0039527 | A1 | 2/2009 | Chan et al. |
| 2009/0166873 | A1 | 7/2009 | Yang et al. |
| 2010/0000775 | A1 | 1/2010 | Shen et al. |
| 2010/0008058 | A1 | 1/2010 | Saen et al. |
| 2010/0109142 | A1 | 5/2010 | Toh et al. |
| 2011/0031633 | A1* | 2/2011 | Hsu ................... H01L 21/76898 257/777 |
| 2011/0076802 | A1* | 3/2011 | Cheng ................... H01L 21/568 438/108 |
| 2011/0175221 | A1* | 7/2011 | Ni .......................... B81B 7/0051 257/737 |
| 2011/0207322 | A1* | 8/2011 | Yamaguchi ....... H01L 21/76898 438/667 |
| 2012/0018868 | A1* | 1/2012 | Oganesian ............. H01L 23/481 257/686 |
| 2012/0068359 | A1 | 3/2012 | Mori et al. |
| 2012/0161190 | A1* | 6/2012 | Yao .................... H01L 23/3677 257/99 |
| 2012/0273939 | A1* | 11/2012 | Dai ................... H01L 21/76898 257/737 |
| 2013/0187246 | A1* | 7/2013 | Adkisson ................. H03H 9/64 257/416 |
| 2013/0285180 | A1 | 10/2013 | Wang et al. |
| 2015/0145116 | A1* | 5/2015 | Uzoh ...................... H01L 24/10 257/712 |
| 2015/0156571 | A1* | 6/2015 | Shim ..................... B06B 1/0292 367/140 |
| 2016/0233139 | A1 | 8/2016 | Gandhi et al. |
| 2017/0053881 | A1 | 2/2017 | Gandhi et al. |
| 2017/0117251 | A1* | 4/2017 | Khan .................. H01L 25/0652 |
| 2018/0102470 | A1* | 4/2018 | Das .................... H01L 25/0652 |
| 2018/0358314 | A1 | 12/2018 | Gandhi et al. |

\* cited by examiner

BONDING PADS WITH THERMAL PATHWAYS

CROSS REFERENCE TO RELATED APPLICATION(S)

This application is a divisional of U.S. patent application Ser. No. 15/344,893 filed. Nov. 7, 2016 and issued as U.S. Pat. No. 10,163,830 on Dec. 25, 2018, which application is a continuation of U.S. patent application Ser. No. 14/617,375 filed Feb. 9, 2015 and issued as U.S. Pat. No. 9,515,002 on Dec. 6, 2016, The aforementioned applications, and issued patents, are incorporated herein by reference in their entirety for any purpose.

BACKGROUND

Thermal management of electrical components, e.g., packaged integrated circuits (ICs), is becoming a greater concern due to the ever shrinking sizes of the components themselves and the systems, e.g., portable electronic devices such as smartphones and tablet computers, they are integrated into. The extraction of heat from small, tightly spaced components is simultaneously becoming more difficult and more important to ensure electrical components operate as intended. Additionally, components are beginning to be manufactured to include multiple co-packaged die, which may come with thermal management concerns of their own. The numerous interfaces these co-packaged die include may increase the barrier to thermal dissipation regardless of the packaging. The internal increases in temperature due to reduced thermal conduction of components and co-packaged die may exceed their operation specifications, which may prevent components from functioning properly. As a result, improvements in heat extraction from semiconductor components may be desired.

Until relatively recently, most packaged semiconductor components included one or two separate die in a single package. With only one or two co-packaged die, heat extraction and dissipation was relatively straight forward. In these scenarios, heat extraction improvements may have simply been obtained by utilizing larger heat sinks, for example. However, as the number of co-packaged die increases, the potential for thermal problems also increases. The increase in thermal problems, e.g., poor heat dissipation/extraction from a stack of die, may partially be due to the distance the heat may need to travel to reach a heat sink or the package and potentially compounded by the number of interfaces which the heat may travel through. Once the heat reaches the heat sink and/or the package, the heat may be dissipated into the surrounding environment. The heat may be generated in active regions of co-packaged die which may be separated from the heat sink by other die. For example, one or more of the co-packaged die may have an active region on a surface of the die, where the active regions include transistors and connections configured to perform operations. The surface that includes the active regions may be separated by the die and/or other die from a heat sink, for example.

The interfaces may be a result of the semiconductor design and resulting fabrication process. For example, a stack of semiconductor die may be electrically interconnected and co-packaged so they operate as a single component capable of performing various functions. Some of the die in the stack, die in the middle of the stack for example, may experience heat increases above normal operating temperatures. This heat, however, may have a less direct path to a heat sink, which may cause the heat to dissipate slower than desired. The indirect path may be partially due to the number of interfaces, e.g., metal, passivation layers, other die in the stack, and so on, which may limit the extraction of the heat. A potential result may be the die in the middle, as in the example, experiencing active region temperatures above specified operating temperatures, which may result in poor performance or inoperability.

DETAILED DESCRIPTION

Apparatuses and methods for the extraction of heat from semiconductor die are disclosed herein. Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

Figure 1:
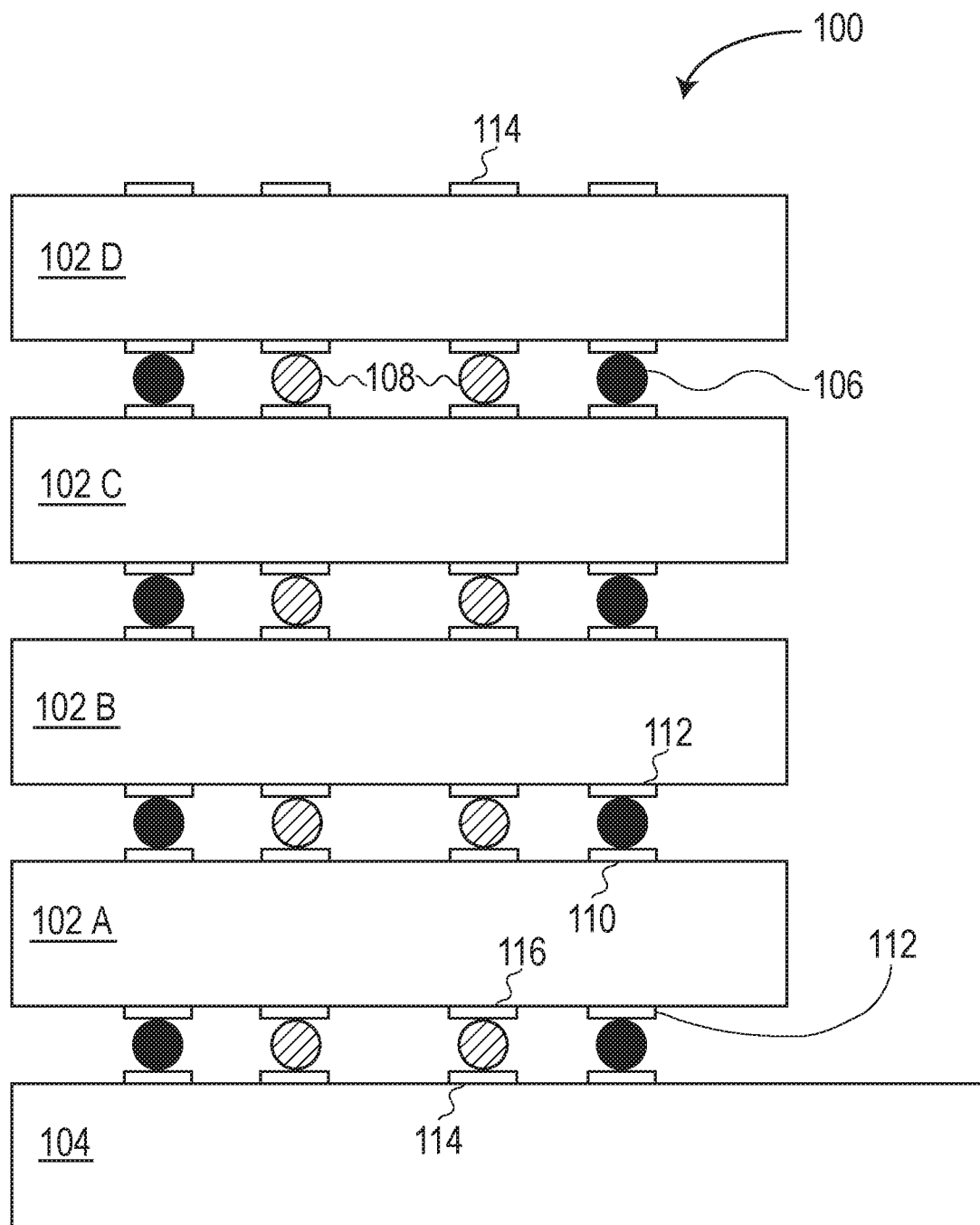
FIG. 1 is a block diagram of a multiple semiconductor die stack in accordance with the present disclosure.

FIG. 1 is a block diagram of a semiconductor die stack 100 in accordance with the present disclosure. The die stack 100 may include a plurality of die, such as the die 102. A through D and the die 104. The number of die 102, 104 depicted in FIG. 1 are shown for illustrative purposes only, the number of die is non-limiting, and any number of die fall within the scope of the present disclosure. The four die 102 A-D may, for example, be any type of semiconductor electronics die such as volatile or non-volatile memory, logic die, communication die, and combinations thereof, and the type of die is a non-limiting aspect of the present disclosure. The die 104 may, for example, be a controller or interface die that receives instructions from external components and provides instructions in response to a target die 102 of the stack 100. The type of die 104, however, is also a non-limiting aspect, and any type of die would fall within the scope of the present disclosure.

The die 102 A-D and the die 104 may be co-packaged and electrically interconnected by a common data and/or command bus. The electrical interconnections may be represented by electrical interconnections 106. The electrical interconnections 106 may be formed on bonding pads located on the surfaces of the die 102 A-D, 104, such as the bonding pads 110 and 112. The packaging materials are not shown for ease of description, but one of skill in the art would understand how the stack 100 may be co-packaged. In operation, for example, the die 104 may receive a command intended for die 102 B and the die 104 may alert the die 102 B to access the common bus as directed to receive the command.

The die 102 A-D and 104 may include a plurality of through-vias, e.g., holes that extend entirely through the die from a first side of the die to a second opposite side of the die, to allow for electrical connections from the front of the die, e.g., the bottom as shown in FIG. 1, to the front of the next die, e.g., the front of a die above and/or below a die. The electrical interconnections may form the common data/command bus by which the plurality of die 102 and 104 are interconnected. The "front" as used herein may imply the side of the die that includes active elements, e.g., transistors, logic gates, etc. The "backside" of the die is the side of the die opposite of the front side of the die. The through-via connectors may originate at one of the plurality of bonding pads 112 located on the front side of a die, for example, and may terminate at one of the plurality of bonding pads 110 located on the backside of the die. The plurality of bonding pads 110 may provide for a bonding location for attaching an adjacent die, e.g., a die mounted on top or to the backside of the die, and further to provide electrical connection to the die stack 100, such as the electrical interconnections 106, so that data and commands may move within the die stack from or to external connections. The plurality of bonding pads 110 and 112 may be characterized as electrically-active since they provide electrical connections for interconnected the plurality of die of the stack 100. For example, the die 104 may include electrical connection to active elements, e.g., transistors, on the front side of the die 104 with the electrical connection (not shown) routed through the die by a conductive through-via to a backside bonding pad, such as one of the plurality of bonding pads 110. The backside bonding pads 110, as noted, may be there to provide electrical connection to a subsequently attached die, such as a die 102 A. The electrical interconnections 106 depicted in FIG. 1 may provide electrical connections between a backside bonding pad 110 and a front side bonding pad 112 on the front side of the subsequently attached die. The electrical interconnections 106 may be formed by any connection process/material known in the art and is a non-limiting aspect of the present disclosure.

In context of the problem described above, the die 102 for example, may generate heat while in operation. Due to the stack of various dies 102 A-D, 104, the dissipation of the heat generated in die 102 A may be limited or reduced, which may result in die 102 A operating above a specified temperature threshold. Other factors that may also add to the limited heat extraction may be the relatively high power operation of the die 104, as well as the environmental temperatures.

Thermal conduction paths may be included in the stack 100 as illustrated by thermal connections 108. The thermal connections 108 may provide additional heat dissipation pathways to the stack 100, which may improve thermal dissipation of heat generated within the stack 100. The thermal connections 108 may connect a plurality of thermal bonding pads 114 located on a backside of a die to a plurality of thermal bonding pads 116 located on a front side of a die. The plurality of thermal bonding pads 114 and 116 may be characterized as electrically-inactive. An "electrically-inactive" thermal bonding pad may be a bonding pad that provides improved thermal conduction for heat away from a die and between adjacent die, but does not provide electrical connection. The thermal connections 108 in combination with the thermal bonding pads 114 may reduce the number of interfaces the heat may travel through within the stack 100, which may improve overall heat dissipation of the stack 100. The thermal bonding pads 114 may be fabricated from one or more metals and may be similar to the electrical interconnections 106 in shape and size for ease of processing and packaging, for example.

In addition to facilitating dissipation of heat, the plurality of thermal bonding pads 114 may also provide added structural support to the stack 100. Due to various interfaces and materials that are the result of semiconductor fabrication and packaging processes, the accumulation of internal heat in an operating device may be significant. The dissipation of the heat may be desired to prevent the internal temperatures from rising above specified operating guidelines. The plurality of thermal bonding pads 114 may be configured so that a portion of the bond on the backside of a die may be at least partially in direct contact with the backside of the die material, e.g., the underlying substrate, instead of or in addition to being in contact with any backside passivation included on the die. For example, a thermal bond pad 114 may be fabricated on the backside of die 104 that may be partially in contact with a backside passivation layer and partially in contact with underlying silicon through channels etched into the backside passivation layer. Direct contact exists when the material of the thermal bonds 114 is adjoining the die material, for example, without any other material disposed between the thermal bonds 114 and the die material. The direct contact with the underlying silicon by the thermal bonding pad may provide a thermal conduction path with higher thermal conductivity/reduced thermal resistance. The intervening backside passivation layer may not provide as high a thermal conductive path as may be needed in high power dissipation scenarios.

FIG. 1 of die stack 100 illustrates a side view of the stack, which only shows a few of the bonds 106 and 108. From a top view, however, each die of the stack 100 may include several bonds on the front and backside. The bonds may be arranged in rows and/or columns of the bonding pads 110, 112, which are electrically-active, and intervening spaces between the electrically-active bonds may include rows and/or columns of the thermal bonds 114, 116. The relative numbers of each type of bonding pad may depend on die size and design but there may be a large number of thermal bonds to a smaller number of electrically-active bonding pads. In terms of thermal performance, the die stack 100 including the thermal bonds may experience decreased operating temperatures over a die stack without the thermal bonds, around a 15% decrease for example.

Figure 2:
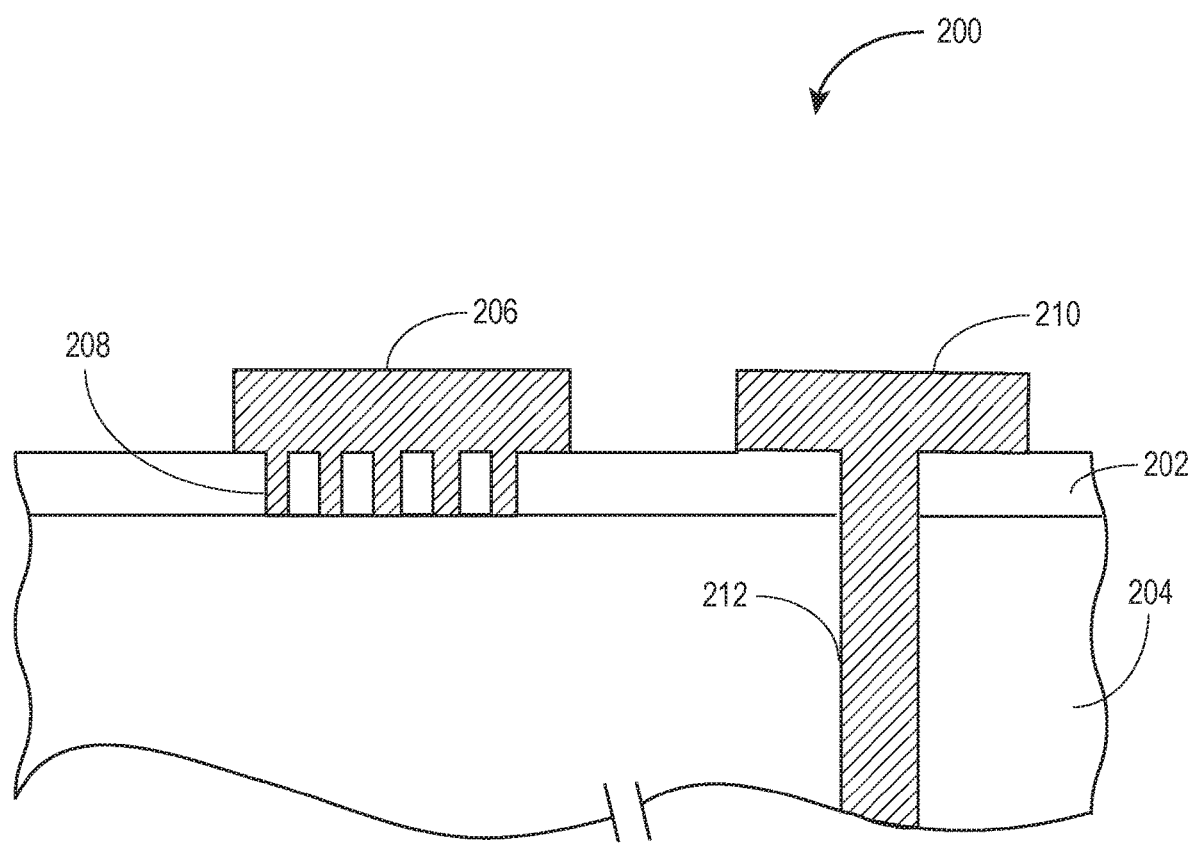
FIG. 2 is an illustrative example of a die backside in accordance with the present disclosure.

FIG. 2 is an illustrative example of a die backside 200 in accordance with the present disclosure. The die backside 200 includes an example electrically-inactive thermal bonding pad 206 and an example electrically-active bonding pad 210, which may be connected to a front side electrically-active bonding pad, such as a bonding pad 112 of FIG. 1, by a through-via conductor 212. The electrically-active bonding pad 210, as shown in FIG. 2, may be partially formed on a backside passivation layer 202 and may make direct electrical contact with the through-via conductor 212. The through-via conductor 212 may be a through-via formed in the substrate 204 and backside passivation 202 coated by one or more metals to provide a conduction path through the substrate 204. The through-via conductor 212 may provide for electrical connection of active regions on the front side of a die from the back side of the die, for example. The through-via may be around 5 microns in diameter, for example. The backside passivation layer 202 may provide protection for the back of the substrate 204. The backside passivation layer 202 may be formed from conventional materials, for example, silicon dioxide, silicon nitride, or a combination thereof. The electrically-active bonding pad 210 may provide an area for subsequent electrical connection, e.g., a bump, ball, or wire bond, to be made for electrical connection and/or packaging purposes, such as the electrical interconnections 106 of FIG. 1. For example, another die may be stacked onto the die backside 200 to form an electrically interconnected stack, such as the stack 100 of FIG. 1.

The electrically-active bonding pad 210 may be a circle with a diameter of around. 30 microns and may be formed from one or more metals and formed in a manner to make connection with the through-via conductor 212. Other shapes, e.g., squares, may also be used for the through-via bonding pad and the size may only be limited by the diameter of the through-via 212. The metals, for example, may be a combination metal stack of copper, nickel, and gold or palladium. Further, the top/exposed metal of the metal stack, gold for example, may assist with bond formations by allowing for the formation of eutectic bonds. The same metal or metals used to form the electrically-active bonding pad 210 may also be used to form the electrically-inactive thermal bonding pad 206, which may ease fabrication processes. Further, the design, e.g., size and shape, of the electrically-inactive thermal bonding pad 206 may be substantially the same as that used for the electrically-active bonding pad 210, but other shapes and sizes fall within the scope of the present disclosure.

The backside passivation layer 202 may have channels 208 formed therein. The channels 208 may allow for the formation of a physical link between the electrically-inactive thermal bonding pad 206 and the substrate 204. During formation of the electrically-inactive thermal bonding pads 206, for example, the channels 208 may be filled with the metal(s) forming the electrically-inactive thermal bonding pads 206. The metal filling the channels 208 may be characterized as metal protrusions, extensions, or fins of the electrically-inactive thermal bonding pads 206, which may be in direct physical contact with the backside of the substrate 204. These protrusions/fins/extensions may provide thermal pathways for heat to travel from the substrate 204 to the electrically-inactive thermal bonding pad 206. The metal protrusions may reduce or eliminate heat traveling through the backside passivation 202. As noted, the backside passivation 202 may be characterized as having a low thermal conductivity. The direct physical connection that the electrically-inactive thermal bonding pad 206 has with the underlying substrate 204 by way of the channels 208 fill metal may provide for a more thermally conductive path for conducting heat from the substrate 204 to the electrically-inactive thermal bonding pads 206. The thermally conductive material forming the bonding pad 206 and the extensions in contact with the substrate 204 may provide a more conductive path for heat to travel out of the substrate 204 than does the backside passivation 202. The more conductive path may be more efficient for heat dissipation than the heat moving through the backside passivation 202. Further, multiple thermal bonding pads 206 including the metal protrusions may be incorporated onto the backside of the substrate 204, such as an array of electrically-inactive thermal bonding pads 206. Thus, an array of electrically-inactive thermal bonding pads 206 including the metal protrusions may substantially improve the dissipation of heat from the substrate 204.

The layout of the channels 208, e.g., from a top view, may take many forms. For example, the channels 208 under the electrically-inactive thermal bonding pad 206 may be in the form of lines that run from one side of the bonding pad to the other. Alternatively, the channels 208 may form concentric circles or a spiral. Other designs may include cross-hatching or a plurality of pillars. The channels 208 may be designed so to maximize contact area between the electrically-inactive thermal bonding pad 206 and the substrate 204 without altering the height and/or structural integrity of the electrically-inactive thermal bonding pad 206. It may be desirable for the height of the thermal boding pad 206 and the electrically-active bonding pad 210 to be substantially equal to ensure soundness of die stacking processes. Further, the materials used to fabricate the electrically-inactive thermal bonding pad 206 and the electrically-active bonding pad 210 may be the same so that they may be fabricated in the same step and with minimal change to existing processes, if at all.

The example bonding pads 206 and 210 shown in FIG. 2 are for illustrative purposes only and only two bonding pads are shown. An entire backside of a die may include a large number of each type of bonding pad—the electrically-inactive thermal bonding pads 206 and the electrically-active bonding pads 210 laid out in a large array or a number of small arrays. The total numbers of each bonding pad type and their relative mix may depend on die design, size, and the number of through-via connectors included. Any mix of bonding pad types and numbers, however, fall within the scope of the present disclosure. For example, a full die may include a number of rows or columns of through-via bonding pads spaced around the backside of the die with a majority of the remaining space taken up by a large number of thermal bonding pads. In such a layout, the backside of the die may appear as an array of bonding pads. The thermal bonding pads may also provide structural support for die to be stacked onto the backside each die.

Figure 3:
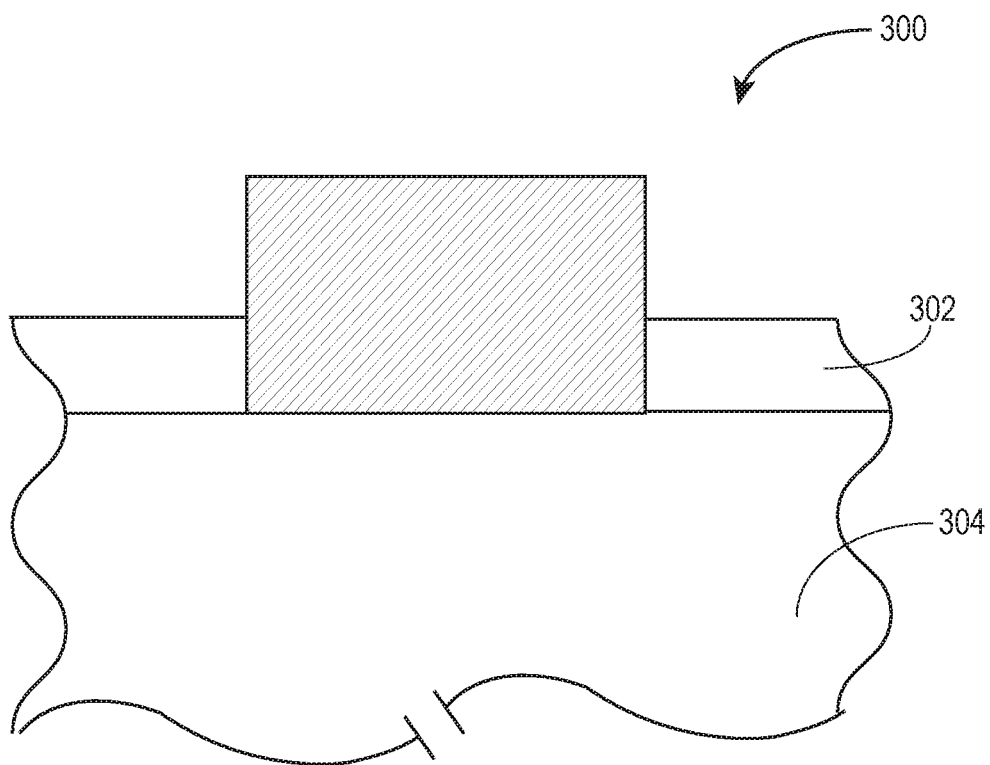
FIG. 3 is an example thermal bonding pad in accordance with the present disclosure.

FIG. 3 is an example thermal bonding pad 300 in accordance with the present disclosure. Instead of including thermal pathways formed in backside passivation trenches, the thermal bonding pad 300 may entirely or almost entirely be in contact with the backside of the die 304. This configuration may advantageously provide more surface area contact between the thermal bonding pad 300 and the substrate 304. An increase in surface area contact may further improve heat extraction from a die stack, such as the die stack 100. As noted above, the height of the thermal bonding pad may advantageously be substantially equal to the height of an electrically-active bonding pad, such as the bonding pad 210 of FIG. 2. Since the thermal bonding pad 300 excludes the channels, such as the channels 208 show in FIG. 2, and is instead completely or mostly deposited onto the backside of the die 304, a height difference between the two types of bonding pads (thermal and electrically-active) may occur, especially if they are fabricated simultaneously. For implementing the thermal bonding pad 300 configuration on the backside of a die that also includes an electrically-active bonding pad, the fabrication of the thermal bonding pad 300 may be performed differently and/or separately from any electrically-active bonding pads. The difference in fabrication if fabricated separately, for example, may be a longer metal deposition step to provide a thermal bonding pad 300 that is substantially equal in height to any electrically-active bonding pads.

Figure 4:
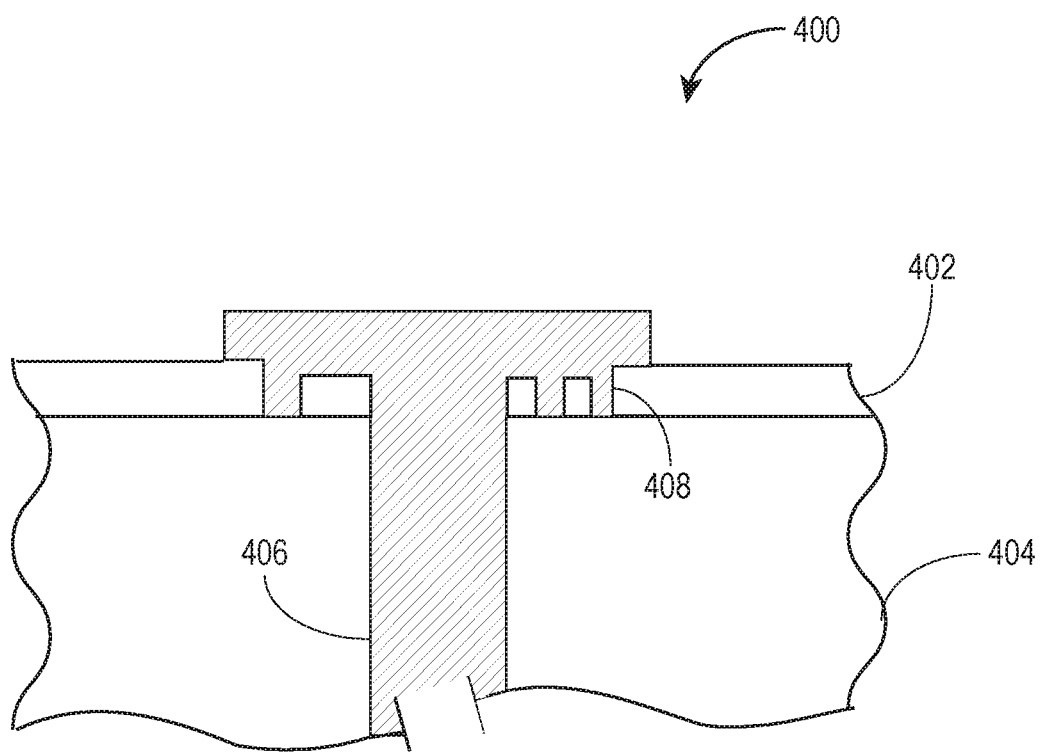
FIG. 4 is an example through-via bonding pad in accordance with the present disclosure.

FIG. 4 is an example electrically-active bonding pad 400 in accordance with the present disclosure. The electrically-active bonding pad 400 may be located on a backside of a die and may provide for electrical connection with an active region located on a front side of the die (not shown). The electrically-active bonding pad 400 may be used for wire or bump bonds to provide connection to a packaging pin, or a die may be bonded to the top (backside) of the die in a die stacking process, for example. The electrically-active bonding pad 400 may be in electrical connection with a through-via conductor 406, which may terminate on the front side of the die. While the electrically-active bonding pad 400 provides the electrical connection for the die, the bonding pad 400 may also be configured to provide thermal pathways for improved thermal dissipation from the substrate 404. These thermal pathways, similar to the thermal bonding pad 206 of FIG. 2, may be metal connections disposed through the backside passivation layer 402. The thermal pathways may include metal extensions/fins that provide direct physical contact with the underlying substrate 404.

The backside passivation 402, underneath the electrically-active bonding pad 400, may include channels 408 formed therein. The channels 408 may then be filled with the metal(s) used to from the electrically-active bonding pad 400 to form the thermal pathways, which may be characterized as extension, protrusion, and/or fins. Filling the channels 408 with the metal may provide for direct connection between the electrically-active bonding pad 400 and the substrate 404. The thermal pathways may enhance thermal dissipation of heat generated in the substrate 404. T.

Figure 5:
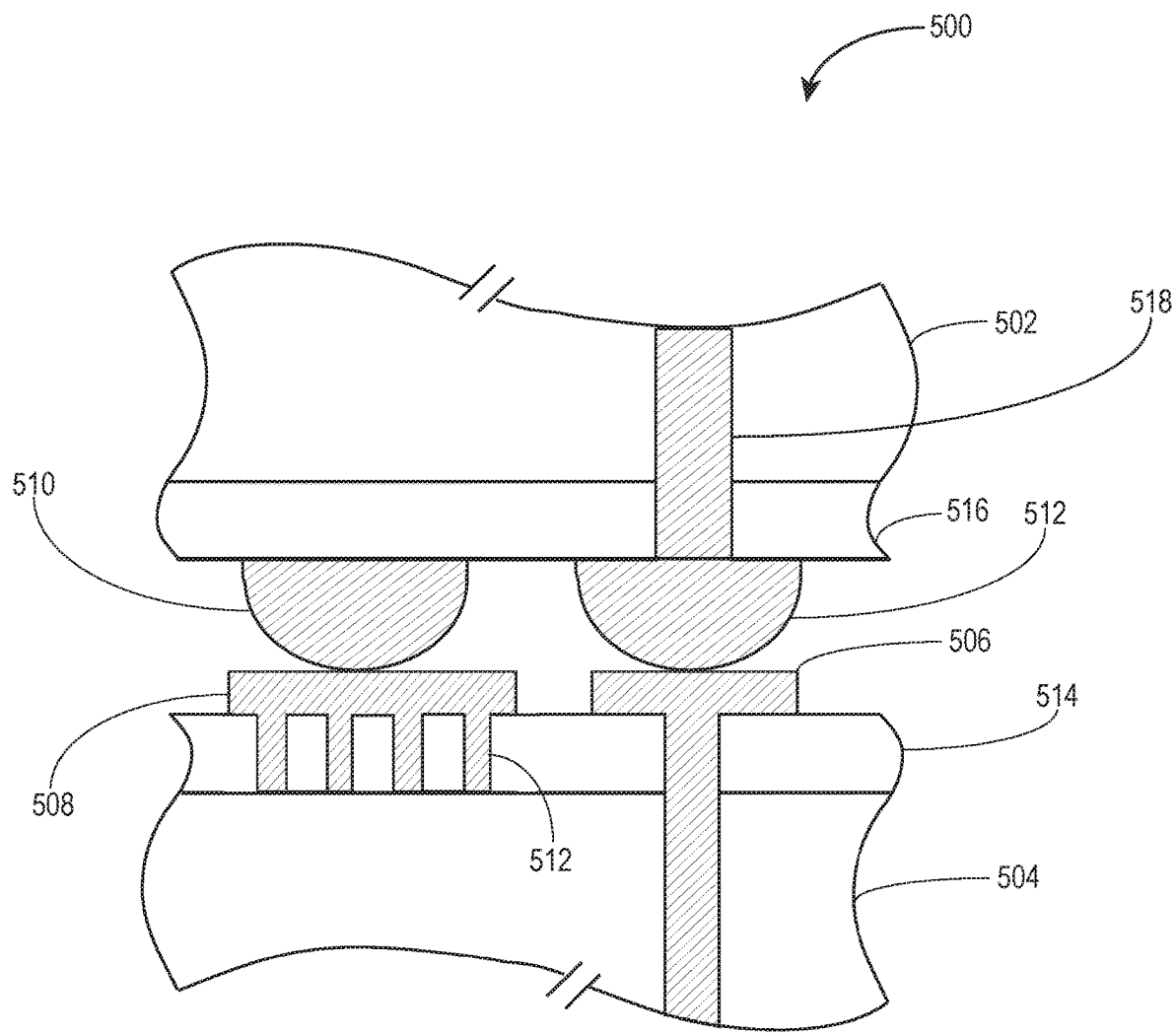
FIG. 5 is an example illustration of stacked die in accordance with the present disclosure.

FIG. 5 is an example illustration of stacked die 500 in accordance with the present disclosure. The stacked die 500 includes a top die 502 and a bottom die 504. The top die 502 may include a through-via conductor 518 connected to an electrically-active bond pad 512. The top die 502 may also include a dummy bond 510. The bottom die 504 may include an electrically-active bonding pad 506 and an electrically-inactive thermal bonding pad 508. The electrically-active bonding pad 506 may, for example, be similar to the electrically-active bonding pad 210 of FIG. 2 or the electrically-active bonding pad 400 of FIG. 4, while the thermal bonding pad 508 may be similar to the thermal bonding pad 206 of FIG. 2 or the thermal boding pad 300 of FIG. 3.

The combination of the through-via conductor 518 and the electrically-active bonding pad 512 may provide electrical connection with an active region of the top die 502. The active region may be formed in the substrate of the die 502 and may further be protected, e.g., underneath, the front side passivation layer 516. The front side passivation layer 516 may include openings that allow the through-via conductor 518 and/or the electrically-active bond pad 512 to make connection with the active region. The dummy bond 510 may be formed on top of the front side passivation layer 516 and may not make electrical connection with any part of the active region. The dummy bond 510 may provide both structural support for the die and a thermal connection between each of the die 502, 504 through the connection with the thermal bonding pad 508 of the bottom die 504.

The metal or metals used to form the bonding pillars of the die 502 may be similar to the metal or metals used to form the thermal bonding pad 508 and the electrically-active bonding pad 506. In some embodiments, the metals may be a stack that includes copper, nickel, and gold. The respective ball bonds of top die 502 may be aligned with the respective bonding pads of bottom die 504 during a die stacking process to provide for electrical and thermal connection between the two die 502 and 504. The die may be aligned using thermal imaging, for example, to ensure the respective pillars and bond pads are properly aligned before the bonds are formed. The connections between the respective bonding pads and bonding pillars may form bonds after a die stacking process is performed, e.g., a metal reflow process. The bonds that form may be metal eutectics. The die stack 500 may be an example connection between two stacked die, such as the die 102 A and 104 of FIG. 1. After alignment and thermal reflow, for example, the respective bonding pads and pillars may form a single bond providing connection between the two die. The top die and bottom die bonds s are depicted separately in FIG. 5, but would likely form a single structure after bond formation.

The electrical connection between the die may allow for electrical signals, e.g., data and/or commands, to pass between the two die 502, 504. For example, the bond that forms between the electrically-active bond pad 512 and the electrically-active bonding pad 506 may provide an electrical connection from the front of the die 504 (not shown) to the front of the die 502. Further, any additional die that may be above and below the die pair 502, 504 may also be electrically connected with the die 502, 504 due to through-via conductors and bonds. If, for example, there were more than two die in the example die stack 500, such as the four die 102 A-D and die 104 of the die stack 100, then electrical signals may be provided by or received by any of the die in the stack due to the electrical connections.

A thermal connection formed between the dummy bond 510 and the thermal bonding pad 508 may provide a thermal conduction path between the two die 502, 504. The thermal connection may provide increased thermal dissipation due to the thermal bonding pad 508 being in partial contact with the substrate of the die 504 by way of metal fins formed in the thermal channels 512. The thermal channels 512 may be filled with the metal of the thermal bonding pad 508 and deposited into the channels 512 formed in a passivation layer 514. The direct connection of the channels 512 with the substrate of the die 504 may provide an improved heat conduction path for heat generated in the die 504. The improvement may be due to allowing the heat to travel through the metal pathways of the thermal bonding pads instead of passing through the passivation layer 514. By expanding the illustrative example of FIG. 5 out to an array of thermal bonds and electrically-active bonds, the overall heat dissipation efficiency of a die stack, such as the stack 100, may appreciably improve.

The formation of the thermal pathways included with the thermal bonding pads may fit into an existing semiconductor processing line using standard processes. Photolithography masks may be used to delineate the trenches to be etched in the backside passivation. Then, the metal deposition step or steps used to form the through-via bond pads may also be used to form the thermal bonding pads with thermal pathways/channels.

In more detail, the process may begin with a coating on the passivation layer on the backside of a semiconductor wafer, the wafer comprising a plurality of die to be stacked, with a layer or two of photoresist. The wafer may then be aligned to a mask for delineating the trenches and exposed. The wafer with the exposed photoresist may then be developed to expose the backside passivation. The backside passivation layer may then be etched, using a plasma dry etch for example, and the photoresist removed. The trenches that form the thermal pathways may now be formed.

Before the bonding pad metal or metals are deposited, an extra photolithography process may be used to delineate the bonding pad areas for the thermal bonding pads and/or the through-via bonding pads. Alternatively, the boding pad areas for both the thermal and the through-via bonding pads may be delineated in a single photolithography step. The bonding pads may be formed over etched trenches. The bonding pad metal(s) may then be deposited, by plating for example, and the photoresist removed. Thermal bonding pads that include the thermal pathways (channels) and through-via bonding pads that may also include thermal pathways are now formed on the backside of a wafer. After further processing steps, if any are included, the wafer may then be diced into the single die. The die may now be ready for die stacking. It should be understood that numerous process methods and sequences may be implemented in fabrication of either the thermal bonding pads, the through-via bonding pads, or both, and one of skill in the art would recognize the numerous ways that could be used. The process discussed herein is meant for illustrative purposes only and any method used falls within the bounds of the present disclosure.

From the foregoing it will be appreciated that, although specific embodiments of the disclosure have been described herein for purposes of illustration, various modifications may be made without deviating from the spirit and scope of the disclosure. For example, a subtractive fabrication process may be used to fabricate the electrically-active and electrically-inactive boding pads. Accordingly, the disclosure is not limited except as by the appended claims.

What is claimed is:

1. A method, comprising:
   forming a passivation layer on a wafer;
   etching a portion of the passivation layer to form etched trenches for thermal pathways; and
   forming a first bonding pad and a second bonding pad on the thermal pathways, wherein forming the first bonding pad and the second bonding pad on the thermal pathways comprises forming the first bonding pad and the second bonding pad to be substantially equal in height.

2. The method of claim 1, further comprising:
   aligning the wafer with a photolithography mask to etch the portion of the passivation layer.

3. The method of claim 1, wherein aligning the passivation layer on the wafer comprises coating the wafer with at least one layer of photoresist.

4. The method of claim 1, wherein etching the portion of the passivation layer to form the etched trenches comprises delineating the etched trenches with a photolithography mask that forms the etched trenches including the thermal pathways.

5. The method of claim 1; further comprising:
   dicing the wafer into a plurality of dies; and
   stacking a first die of the plurality of dies onto a second die of the plurality of dies.

6. The method of claim 1, further comprising forming the thermal pathways in the etched trenches.

7. The method of claim 6, wherein forming the thermal pathways comprises forming the thermal pathways as concentric circles or as a spiral in the etched trenches of the passivation layer.

8. The method of claim 6; wherein forming the thermal pathways comprises distributing the formation of the thermal pathways in parallel, relative to each other.

9. The method of claim 1, wherein forming the bonding pad on the thermal pathways comprises:
   plating the bonding pad on the thermal pathways and the passivation layer; and
   removing photoresist from the wafer.

10. The method of claim 1, wherein etching the portion of the passivation layer to form the etched trenches comprises using a plasma dry etch to etch the portion of the passivation layer.

11. A method, comprising:
   forming a passivation layer on a wafer;
   etching a first portion of the passivation layer and the wafer to forma through-via from a frontside of the wafer to a backside of the wafer;
   etching a second portion of the passivation layer to form etched trenches for metal protrusions;
   forming a first bonding pad on the through-via; and
   forming a second bonding pad on the metal protrusions, wherein forming the first bonding pad on the through via and forming the second bonding pad on the metal protrusions comprises forming the first bonding pad and the second bonding pad to be substantially equal in height.

12. The method of claim 11, further comprising forming the metal protrusions in the etched trenches.

13. The method of claim 11, wherein forming the metal protrusions comprises forming the metal protrusions to extend along a length of the second bonding pad.

14. The method of claim 11, wherein forming the first bonding pad on the through-via as a circular bonding pad on the through-via.

15. The method of claim 11, wherein the first bonding pad includes a first metal stack comprising at least one of copper, nickel, gold, or palladium, and wherein the second bonding pad includes a second metal stack comprising at least one of copper, nickel, gold, or palladium.

16. The method of claim 11, comprising:
   delineating a first bonding area with a first photolithography mask for forming the first bonding pad; and
   delineating a second bonding area with a second photolithography mask for forming the second bonding pad.

17. The method of claim 11, further comprising:
   delineating bonding areas with a photolithography mask for forming the first and second bonding pads.

18. The method of claim 11, further comprising:
   forming an electrical bond with the first bonding pad to provide electrical connectivity through the wafer.

19. The method of claim 11, further comprising:
   forming a bond with the second bonding pad to provide a thermal conduction path from the wafer.

* * * * *